United States Patent
Wang et al.

(10) Patent No.: US 9,698,106 B2
(45) Date of Patent: Jul. 4, 2017

(54) METAL DEPOSITION ON SUBSTRATES

(71) Applicant: Infineon Technologies Austria AG, Villach (AT)

(72) Inventors: Kae-Horng Wang, Villach (AT); Francisco Javier Santos Rodriguez, Villach (AT); Michael Knabl, Sattendorf (AT); Guenther Koffler, Ledenitzen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/073,551

(22) Filed: Mar. 17, 2016

(65) Prior Publication Data

US 2016/0203979 A1    Jul. 14, 2016

Related U.S. Application Data

(62) Division of application No. 14/185,272, filed on Feb. 20, 2014, now Pat. No. 9,318,446.

(Continued)

(51) Int. Cl.
*H01L 21/67* (2006.01)
*H01L 23/00* (2006.01)
(Continued)

(52) U.S. Cl.
CPC ........... *H01L 23/564* (2013.01); *C23C 16/34* (2013.01); *C23C 16/40* (2013.01); *C23C 16/50* (2013.01); *C23C 18/1619* (2013.01); *G03F 7/16* (2013.01); *G03F 7/20* (2013.01); *G03F 7/26* (2013.01); *H01J 37/32889* (2013.01); *H01L 21/02274* (2013.01); *H01L 21/288* (2013.01); *H01L 21/31144* (2013.01); *H01L 21/6715* (2013.01); *H01L 23/485* (2013.01); *H01J 2237/3321* (2013.01); *H01L 21/02035* (2013.01); *H01L 21/02038* (2013.01); *H01L 21/6723* (2013.01);
(Continued)

(58) Field of Classification Search
CPC .......... H01L 21/67225; H01L 21/6723; H01L 21/02035; H01L 21/02038; H01L 27/14683
USPC .............................................. 29/25.03, 25.01
See application file for complete search history.

(56) References Cited

U.S. PATENT DOCUMENTS 4,102,732 A    7/1978   Kato et al.
5,953,630 A    9/1999   Maeda et al.
(Continued)

FOREIGN PATENT DOCUMENTS

| JP | 09116133 A | 5/1997 |
| JP | 09298196 A | 11/1997 |
| JP | 2013026453 A | 2/2013 |

OTHER PUBLICATIONS

Boulord, C., et al., "Characterization and optimization of electroless nickel plating fro front side silicon solar cells metallization," 2nd Workshop on Metalization, Konstanz, Apr. 14, 2010, 4 pages.

(Continued)

*Primary Examiner* — George Fourson, III
(74) *Attorney, Agent, or Firm* — Slater Matsil, LLP

(57) ABSTRACT

Various techniques, methods, devices and apparatus are provided where an isolation layer is provided at a peripheral region of the substrate, and one or more metal layers are deposited onto the substrate.

12 Claims, 4 Drawing Sheets

Related U.S. Application Data

(60) Provisional application No. 61/791,201, filed on Mar. 15, 2013.

(51) Int. Cl.

| | |
|---|---|
| *H01L 21/02* | (2006.01) |
| *C23C 16/34* | (2006.01) |
| *C23C 16/40* | (2006.01) |
| *C23C 16/50* | (2006.01) |
| *C23C 18/16* | (2006.01) |
| *G03F 7/16* | (2006.01) |
| *G03F 7/20* | (2006.01) |
| *G03F 7/26* | (2006.01) |
| *H01J 37/32* | (2006.01) |
| *H01L 21/311* | (2006.01) |
| *H01L 21/288* | (2006.01) |
| *H01L 23/485* | (2006.01) |
| *H01L 27/146* | (2006.01) |

(52) U.S. Cl.
CPC .. *H01L 21/67225* (2013.01); *H01L 27/14683* (2013.01); *H01L 2924/0002* (2013.01)

(56) References Cited

U.S. PATENT DOCUMENTS

| | | |
|---|---|---|
| 2004/0061195 A1 | 4/2004 | Okada et al. |
| 2006/0165892 A1* | 7/2006 | Weidman ............... C23C 16/06 427/248.1 |
| 2008/0163139 A1* | 7/2008 | Scheffer ............... H01L 22/20 438/14 |
| 2010/0267175 A1 | 10/2010 | Amada et al. |
| 2011/0018116 A1 | 1/2011 | Feng |
| 2012/0161307 A1 | 6/2012 | Feng |
| 2013/0248928 A1 | 9/2013 | Yoshioka et al. |
| 2014/0097473 A1 | 4/2014 | Ikura |
| 2015/0108574 A1 | 4/2015 | Sung |
| 2015/0115415 A1 | 4/2015 | Mischitz |

OTHER PUBLICATIONS

Chapman Instruments, "Semiconductor Wafer Edge Analysis," Chapman Technical Note-TW-1 waf_edge.doc Rev-98-07, received Feb. 19, 2014, 18 pages.

Disco, "Taiko Process," Kiru, Kezuru, Migaku Technologies, http://www.discousa.com/eg/solution/library/taiko.html, dated Feb. 19, 2014. 3 pages.

\* cited by examiner

METAL DEPOSITION ON SUBSTRATES

This is a divisional application of U.S. application Ser. No. 14/185,272 filed on Feb. 20, 2014, entitled "Metal Deposition on Substrates," which claims the benefit of U.S. Provisional Application No. 61/791,201 filed on Mar. 15, 2013, entitled "Metal Deposition on Substrates," both of which are incorporated herein by reference.

FIELD OF THE INVENTION

The present application relates to metal deposition on substrates like semiconductor wafers.

BACKGROUND

When manufacturing semiconductor devices on substrates like semiconductor wafers, for example silicon wafers, metal is deposited on the substrate, for example on a non-processed backside of the substrate or a processed front side of the substrate, to provide electrical contacts to the semiconductor devices and/or to provide interconnects between various parts of the devices manufactured. Various metal deposition techniques are conventionally used, for example sputtering, galvanization or so-called electroless plating. One example for electroless plating is electroless nickel plating, where an autocatalytic deposition of nickel phosphorus (NiP) by immersion of the substrate into a plating bath may be used. In some cases, this may lead to the formation of nickel flitters, for example in a peripheral region of the substrate. Similar phenomena may occur using other metals. Such flitters have a poor adherence to the substrate, which constitutes a quality risk and which may require additional measures when manufacturing semiconductor devices, like regular change of filters or of a plating bath used.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawing, in which.

DETAILED DESCRIPTION

Figure 1:
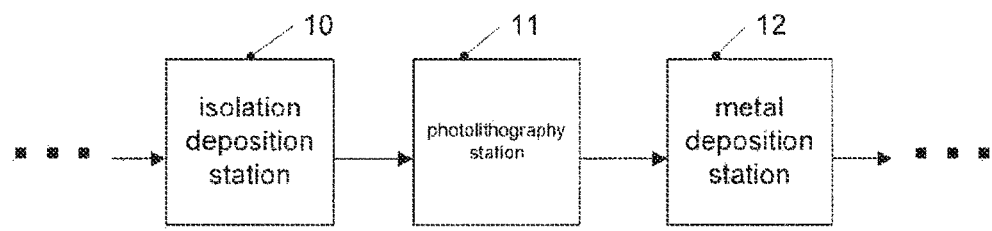
FIG. 1 is a schematic diagram of an apparatus for manufacturing semiconductor devices according to an embodiment.

Various embodiments of the present invention will be described in the following with reference to the accompanying figures. It is to be noted that these embodiments serve illustration purposes only and are not to be construed as limiting the scope in any way. Features of various embodiments described may be combined with each other unless specifically noted otherwise. On the other hand, describing an embodiment with a plurality of features is not to be construed as indicating that all those features are necessary for practicing the techniques disclosed herein or described in the drawings, as other embodiments may comprise less features and/or alternative features.

In various embodiments discussed and described in more detail below, a substrate, for example a semiconductor wafer, is provided with an isolation layer at a peripheral region thereof prior to a metal deposition. The metal deposition may comprise an electroless plating, for example, an electroless plating of nickel, as will be described further below. However, applications of the techniques and apparatuses described in the following are not limited to specific metals or substrates. In some embodiments, by forming the isolation at the peripheral region of the substrate, formation of flitter like nickel flitter may be prevented, minimized or reduced. The peripheral region of the substrate generally is a region at or near the edge of the substrate. For example, it may include a peripheral portion of a top or bottom side (front or back side) of the substrate extending from the edge inwards, and/or the edge, i.e. the side surface, or part thereof. The edge may have various shapes, for example a rounded shape or a beveled shape. In some embodiments, the peripheral region may comprise a ring thicker than the remaining substrate or part of the ring.

Turning now to the figures, in FIG. 1 an apparatus for manufacturing semiconductor devices according to an embodiment is shown. The apparatus of FIG. 1 is shown as comprising an isolation deposition station 10, a photolithography station 11 and a metal deposition station 12, which may serve as an example for an implementation of techniques according to some embodiments as will be described further below. As indicated by dots, the apparatus of FIG. 1 may further comprise other processing stations for processing substrates, in particular semiconductor wafers, according to standard processing techniques, for example prior to station 10. For example one or more stations for ion implantation to obtain doping, further lithography stations like photolithography stations or electron beam lithography stations, further metallization stations and the like which are conventionally employed for example to manufacture semiconductor devices based on semiconductor wafers may be provided.

Stations 10-12 depicted in FIG. 1 in an embodiment may for example serve to provide a backside metallization of a substrate, for example a semiconductor wafer (which may have undergone previous processing to form semiconductor devices for example on a front side thereof). However, techniques, apparatuses and devices disclosed herein may also be applied to front side metallization.

Stations 10-12 in some embodiments may be employed for a backside metallization of thinned wafers, for example wafers thinned to a thickness at or below 100 μm. As a thinning method in such cases, for example a processing, where a central portion of the wafer is thinned, leaving a ring at a peripheral region of the wafer, may be employed. In other embodiments, the wafer may be completely thinned, or a wafer with a regular (non-thinned) thickness may be used.

In isolation deposition station 10, an isolating film, for example an oxide, a nitride or a combination thereof, is deposited on the substrate, including a peripheral region of the substrate. A deposition technique which may be employed by isolation deposition station 10 is for example plasma-enhanced chemical vapor deposition (PECVD), but is not limited thereto.

In photolithography station 11, the isolation deposited in isolation deposition station 10 is limited to a peripheral region, for example including the above-mentioned ring (for example a so-called Taiko ring) or part thereof and/or an edge, e.g., a beveled edge of the substrate. The peripheral region on a top or bottom surface may have a width smaller than 20 mm, smaller than 10 mm, smaller than 5 mm or even smaller than 1 mm, and may include a side face of the substrate or part thereof. To achieve this, standard photolithography operations like coating with photoresist, irradiating the photoresist, developing the photoresist and etching may be used.

Following this, in metal deposition station 12 metal is deposited onto the substrate side where the isolation is present in the peripheral region. In other embodiments, other techniques than deposition techniques may be used to form a metal layer. For example, an aluminum layer followed by a nickel layer may be deposited. The nickel layer may be deposited using electroless plating in a nickel phosphide (NiP) bath. In some embodiments, due to the presence of the isolation in the peripheral region a formation of flitter may be reduced, minimized or prevented.

After metal deposition station 12, again as indicated by dots, further conventional processing may take place in further processing stations, as mentioned above or for example also contacting, sawing, packaging, testing and the like.

It is to be noted that while three stations are shown in FIG. 1, the functionality described may also be implemented using a different number of stations, devices, systems and the like.

Figure 2:
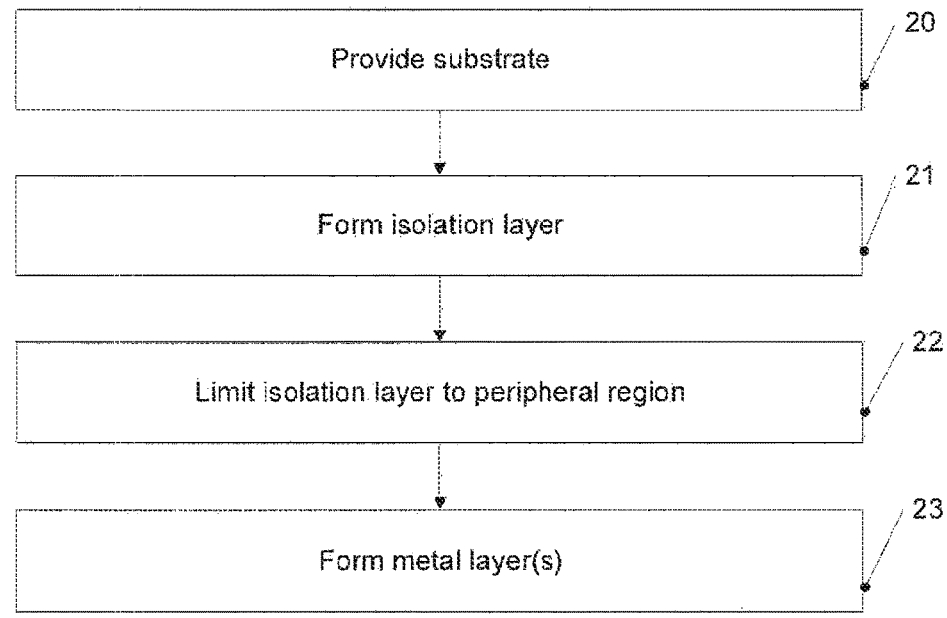
FIG. 2 is a flowchart illustrating a method according to an embodiment.

In FIG. 2, a flowchart illustrating a method according to an embodiment is shown. While the method of FIG. 2 will be explained as a series of acts or events, it should be noted that the illustrated order is not to be construed as limiting, as at least some of the acts or events may be performed in a different order or concurrently or in combination with each other. Furthermore, in other embodiments additional acts or events not depicted in FIG. 2 may be implemented.

At 20, a substrate is provided. The substrate may for example be a semiconductor wafer like a silicon wafer. In some embodiments, the substrate may have undergone processing, for example undergone processing steps to form semiconductor devices on the substrate. Furthermore, the substrate may have been thinned, for example by a ring-forming process as explained above or by any other thinning process which may for example use grinding or etching to thin the wafer. In other embodiments, the substrate may have a regular (non-thinned) thickness.

At 21, an isolation layer, for example an oxide layer (for example, $SiO_2$) or a nitride layer (for example, $Si_3N_4$) is formed, e.g., deposited on the side of the substrate to be metallized, for example a backside of the substrate, the front side being the side where devices like semiconductor devices are formed in this case. In other embodiments, the isolation layer may be deposited on the front side or on both sides. At 22, the isolation layer is limited to a peripheral region of the substrate, for example a region comprising a ring in case of substrates having undergone a corresponding processing and/or an edge, e.g., a beveled edge of the substrate. In some embodiments, the peripheral region has a width of less than 20 mm, less than 10 mm, less than 5 mm or less than 1 mm. The limiting may be performed by photolithography steps or other lithography steps which leads to a removal of the isolation layer outside the peripheral region. In other embodiments, limiting the isolation layer to the peripheral region may comprise forming, e.g., depositing the isolation layer using for example a shadow mask such that the isolation layer is formed only in the peripheral region (which corresponds to the actions of 21 and 22 being performed with a single process, namely forming with a shadow mask), or providing a soluble material in a center region surrounded by the peripheral region prior to the depositing, and dissolving the soluble layer (like a photoresist layer) after the deposition, so that the isolation layer in the center region is removed. Therefore, various possibilities for forming an isolation layer only in a peripheral region are possible.

At 23, one or more metal layers are formed, e.g., deposited, on the side of the substrate, the peripheral region of which is covered by the isolation layer. For example, a first metal layer followed by a second metal layer may be deposited. The first metal layer and/or the second metal layer may be deposited by electroless plating, although other methods also may be used. The first metal layer may be a layer comprising aluminum and the second metal layer may be a nickel layer, for example, a layer comprising nickel deposited by electroless plating using a nickel phosphate (NiP) bath. In this example, the second metal layer comprises nickel, which may be in the form of at least one of pure nickel, nickel alloy or nickel compound. Similarly, the first layer could comprising aluminum in the form of at least one of pure aluminum, aluminum alloy or aluminum compound. It is understood that a pure metal layer could include trace impurities.

Figure 3A:
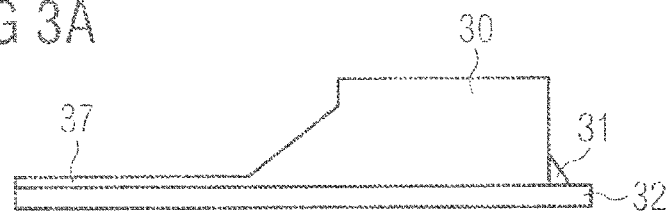
FIGS. 3A to 3D illustrate several stages during manufacturing a device according to an embodiment, the device being shown in FIG. 3E.
Figure 3B:
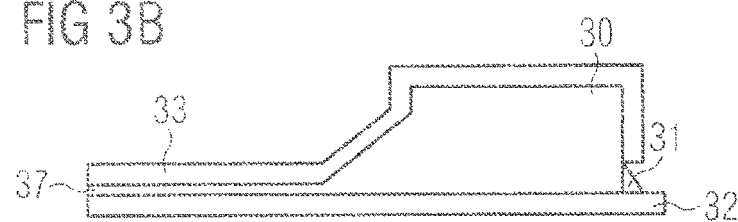
Figure 3C:
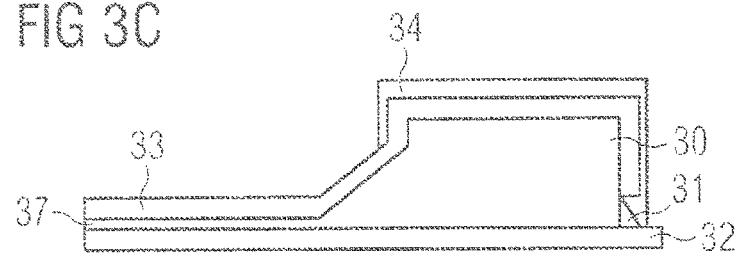
Figure 3D:
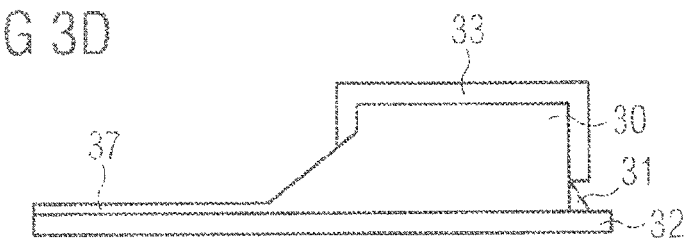
Figure 3E:
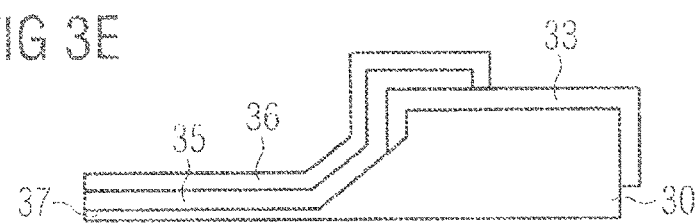

Next, a device according to an embodiment as shown in FIG. 3E together with FIGS. 3A-3D illustrating intermediate stages of the device during manufacture will be discussed. The device of FIG. 3E may for example be manufactured using the apparatus explained with reference to FIG. 1 and/or using the method explained with reference to FIG. 2, but also may be manufactured using other apparatuses or methods. FIGS. 3A-3E show cross-sectional views of a part of a substrate 37 including a peripheral region of substrate 37.

In FIG. 3A, an outer part of a substrate 37 including n peripheral region thereof is shown. Substrate 37 may be a silicon substrate thinned with a ring-forming method as mentioned above, leaving a ring 30, for example a Taiko ring, at the peripheral region of substrate 37. Substrate 37 is mounted to a carrier 32 using an adhesive 31. The side of substrate 37 facing carrier 32 may be a front side of the substrate, for example a side where semiconductor devices are formed, and will be referred to as first side below, and the side of substrate 37 facing away from carrier 32 may be a backside of substrate 37, and will be referred to as second side below. In some embodiments, carrier 32 may be a tape, for example a backgrinding tape (BG tape). However, other suitable carriers may be used as well. In still other embodiments, adhesive 31 and/or carrier 32 may be omitted, or an adhesive may be restricted to locations between carrier and substrate.

In a next processing step, illustrated in FIG. 3B an isolation layer 33, for example an oxide layer or a nitride layer, is deposited on substrate 37, including the peripheral region comprising ring 30. The deposition of the isolation layer 33 may be performed at low temperatures, for example temperatures below 250° C., such that the adhesive properties of adhesive 31 are not affected. In an embodiment, plasma-enhanced chemical vapor deposition is used for depositing isolation layer 33, although other techniques also may be used.

Following deposition of the isolation layer, the second side of substrate 37, i.e. the isolation layer, is covered by photoresist, for example by spinning, exposed to light for example through a mask and developed such that the photoresist 34 remains only on the peripheral region of the substrate 37, in this case covering ring 30 including part of a side face thereof. In case of photoresist 34 being for example a so-called positive resist, a center region of substrate 37 (i.e., a region inside the peripheral region) may be exposed to light, and then the photoresist may be developed. In the case of a negative resist, the resist may be exposed to light in the peripheral region, and again through developing only the resist in the peripheral region remains, as shown in FIG. 3C.

The deposition of the isolation layer may be for example performed in isolation deposition station 10 and/or constitutes an example for the deposition of an isolation layer at 21 in FIG. 2.

After providing the photoresist in the peripheral region, the isolation layer 33 not covered by the photoresist is removed, for example by etching, and after this the remaining photoresist is removed, leading to the situation shown in FIG. 3D where isolation layer 33 is only present in the peripheral region, in this case covering ring 30.

To form the device shown in FIG. 3E, finally metal layers are deposited on substrate 37. In the example shown, a first metal layer 35, for example an aluminum layer, is deposited followed by a nickel layer 36. In the embodiment shown, the nickel layer 36 is deposited by electroless plating, for example using a nickel phosphide (NiP) bath. However, other metals and/or other deposition methods may also be used. As can be seen, at the peripheral region of substrate 37 metal layers 35, 36 do not "end" on the material of substrate 37, but on isolation layer 33, which may help to prevent flitter from occurring. By covering a peripheral region at the edge of substrate 37 with isolation layer 33 as shown, in some embodiments it may be insured that metal layers 35, 36 always end on the isolation layer 33. It should be noted that the number of two metal layers in FIG. 3E serves only as an example, and only one metal layer or more than two metal layers may also be deposited.

Furthermore, as can be seen in FIG. 3E, after the metal deposition the carrier 32 and adhesive 31 are removed, for example by dissolving adhesive 31.

While the device of FIG. 3E comprises a thinned substrate 37, for example thinned to less than 100 µm, having a ring 30, in other embodiments other types of substrate may be used. For example, a completely thinned substrate without ring may be used, or a regular substrate having for example a thickness of 400 µm to 1000 µm may be used.

Such a device according to an embodiment shown in FIG. 4E together with FIGS. 4A-4D illustrating intermediate stages of the device during manufacture will be discussed. The device of FIG. 4E may for example be manufactured using the apparatus explained with reference to FIG. 1 and/or using the method explained with reference to FIG. 2, but also may be manufactured using other apparatuses or methods. FIGS. 4A-4E show cross-sectional views of a part of a substrate 40 including an peripheral region of substrate 40.

Figure 4A:
FIGS. 4A to 4D illustrate several stages during manufacturing a device according to a further embodiment, the device being shown in FIG. 4E.

In FIG. 4A, an outer part of substrate 40 including an peripheral region thereof is shown. Substrate 40 may be a silicon substrate thinned over its whole surface or a regular (un-thinned) silicon substrate, for example with a thickness of the order of 400-1000 µm. Substrate 40 is mounted to a carrier 42 using an adhesive 41. The side of substrate 40 facing carrier 42 may be a front side of the substrate, for example a side where semiconductor devices are formed, and will be referred to as first side below, and the side of substrate 40 facing away from carrier 42 may be a backside of substrate 40, and will be referred to as second side below. Carrier 42 may be a glass carrier. However, other types of carriers may be used as well.

Figure 4B:
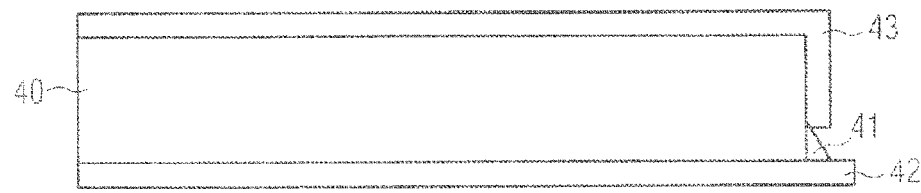

In a next processing step, illustrated in FIG. 4B an isolation layer 43, for example an oxide layer or a nitride layer, is deposited on substrate 40, including the peripheral region of substrate 40. The deposition of the isolation layer 43 may be performed at low temperatures, for example temperatures below 250° C., such that the adhesive properties of adhesive 41 are not affected. In an embodiment, plasma-enhanced chemical vapor deposition is used for depositing isolation layer 43, although other techniques also may be used.

The deposition of the isolation layer may be for example performed in isolation deposition station 10 and/or constitutes an example for the deposition of an isolation layer at 21 in FIG. 2.

Figure 4C:
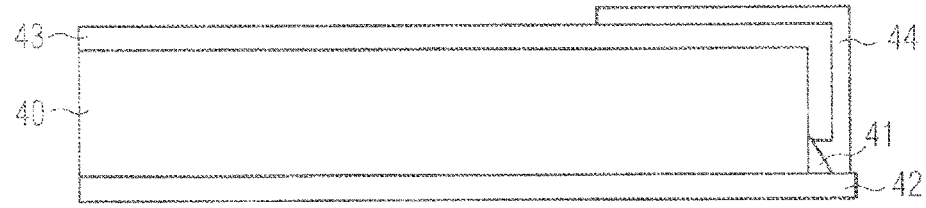

Following deposition of the isolation layer, the second side of substrate 40, i.e. the isolation layer, is covered by photoresist, for example by spinning, exposed to light for example through a mask and developed such that the photoresist 44 remains only on the peripheral region of the substrate 40, covering the same. In case of photoresist 44 being for example a so-called positive resist, a center region of substrate 40 (i.e., a region inside the peripheral region) may be exposed to light, and then the photoresist may be developed. In the case of a negative resist, the resist may be exposed to light in the peripheral region, and again through developing only the resist in the peripheral region remains, as shown in FIG. 4C.

Figure 4D:
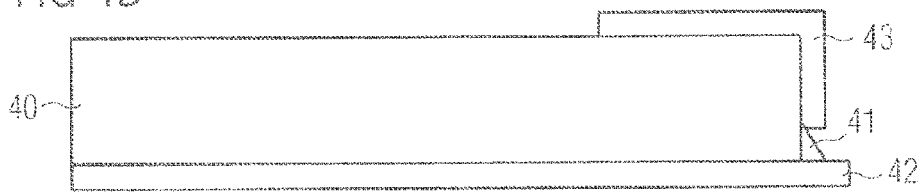
Figure 4E:
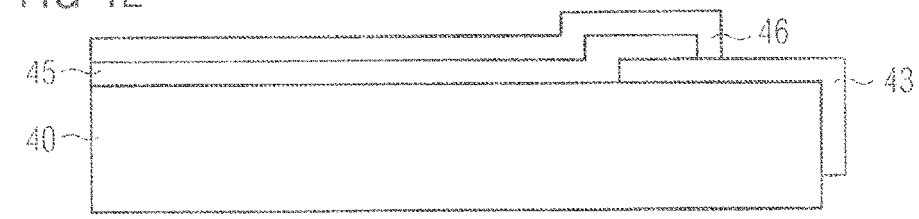

After providing the photoresist in the peripheral region, the isolation layer 43 not covered by the photoresist is removed, for example by etching, and after this the remaining photoresist is removed, leading to the situation shown in FIG. 4D where isolation layer 43 is only present in the peripheral region.

To form the device shown in FIG. 4E, finally metal layers are deposited on substrate 40. In the example shown, a first metal layer 45, for example an aluminum layer, is deposited followed by a nickel layer 46. In the embodiment shown, the nickel layer 46 is deposited by electroless plating, for example using a nickel phosphide (NiP) bath. However, other metals and/or other deposition methods may also be used. As can be seen, at the peripheral region of substrate 40 metal layers 45, 46 do not "end" on the material of substrate 40, but on isolation layer 43, which may help to prevent flitter from occurring. By covering a peripheral region at the edge of substrate 40 with isolation layer 43 as shown, in some embodiments it may be insured that metal layers 45, 46 always end on the isolation layer 43. It should be noted that the number of two metal layers in FIG. 4E serves only as an example, and only one metal layer or more than two metal layers may also be deposited.

Furthermore, after the metal deposition the carrier 42 and adhesive 41 may be removed, for example by dissolving adhesive 41.

In the embodiments of FIGS. 3 and 4, two metal layers are deposited after providing an isolation layer in a peripheral region of the substrate. In other embodiments, an isolation layer in a peripheral region is provided between two metal layer. This situation is shown in the embodiment of FIG. 5.

Figure 5:
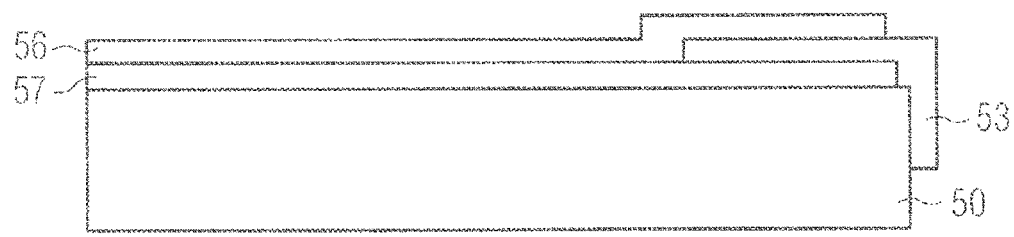
FIG. 5 illustrates a device according to another embodiment.

In FIG. 5, a substrate 50 is mounted to a carrier like a glass carrier using an adhesive 51, similar to the situation of FIGS. 4A-4E. A first metal layer 57 is deposited onto substrate 50. The deposition of first metal layer 57 is followed by provision of an isolation layer 53 limited to a peripheral region of substrate 50. To form the device shown in FIG. 5, a second metal layer 56 is deposited which ends on isolation layer 53.

The general processing and materials for the embodiment of FIG. 5 apart from the different order of the layers may correspond to what was already explained with respect to FIGS. 3 and 4. Moreover, while FIG. 5 shows a flat substrate, also for a substrate having a ring as shown in FIG. 3 an isolation layer limited to a peripheral region may be provided between two metal layers. Also, after deposition of metal layer 56 or prior to deposition of metal layer 57 further layers, e.g., metal layers, may be deposited.

While specific types of substrates, carriers or other materials have been described with reference to FIGS. 3 to 5, these serve only as examples, and other materials and material combinations may be used as well.

As can be seen from the above detailed description, numerous modifications and variations are possible without departing from the scope of the present application. Therefore, the embodiments discussed are not to be construed as limiting the scope of this application in any way.

What is claimed is:

1. An apparatus comprising:
    an isolation forming device configured to form an isolation layer over a substrate, the isolation forming device comprising a mask designed and arranged to limit the isolation layer to a peripheral region of the substrate; and
    a metal deposition station configured to deposit at least one metal layer over a side of the substrate.

2. The apparatus of claim 1, wherein the isolation forming device comprises an isolation deposition station configured to deposit the isolation layer over the side of the substrate, and a lithography station configured to restrict the isolation layer to the peripheral region of the substrate.

3. The apparatus of claim 2, wherein the lithography station is configured to coat the isolation layer with a photoresist, to partially expose the photoresist to light, to partially remove the photoresist, and to remove the isolation layer at places where the photoresist has been removed.

4. The apparatus of claim 1, wherein the isolation forming device is configured to perform a plasma-enhanced chemical vapor deposition.

5. The apparatus of claim 1, wherein the isolation forming device is configured to form at least one of an oxide or a nitride.

6. The apparatus of claim 1, wherein the metal deposition station comprises an electroless plating device.

7. An apparatus comprising:
    an isolation forming device for forming an isolation layer over a semiconductor wafer, the isolation forming device comprising a mask designed and arranged to substantially limit the isolation layer to a peripheral region of the semiconductor wafer; and
    a metal deposition station for depositing at least one metal layer over a side of the semiconductor wafer, the metal layer being at least partially adjacent the isolation layer.

8. The apparatus of claim 7, wherein the isolation forming device comprises an isolation deposition station for depositing the isolation layer over the side of the semiconductor wafer, and a lithography station configured to restrict the isolation layer to the peripheral region of the semiconductor wafer.

9. The apparatus of claim 8, wherein the lithography station is configured to coat the isolation layer with a photoresist, to partially expose the photoresist to light, to partially remove the photoresist, and to remove the isolation layer at places where the photoresist has been removed.

10. The apparatus of claim 7, wherein the isolation forming device is configured to perform a plasma-enhanced chemical vapor deposition.

11. The apparatus of claim 7, wherein the isolation forming device is configured to form at least one of an oxide or a nitride.

12. The apparatus of claim 7, wherein the metal deposition station comprises an electroless plating device.

* * * * *